US010763567B1

(12) United States Patent
Liu

(10) Patent No.: US 10,763,567 B1
(45) Date of Patent: Sep. 1, 2020

(54) HIGH DIRECTIVITY COMPACT SIZE INTER LAYER COUPLER

(71) Applicant: JABIL INC., St. Petersburg, FL (US)

(72) Inventor: Lintao Liu, Kanata (CA)

(73) Assignee: JABIL INC., St. Petersburg, FL (US)

( * ) Notice: Subject to any disclaimer, the term of this patent is extended or adjusted under 35 U.S.C. 154(b) by 0 days.

(21) Appl. No.: 16/299,674

(22) Filed: Mar. 12, 2019

(51) Int. Cl.
*H01P 3/08* (2006.01)
*H01P 5/18* (2006.01)
*H03F 3/21* (2006.01)

(52) U.S. Cl.
CPC ............... *H01P 3/082* (2013.01); *H03F 3/21* (2013.01)

(58) Field of Classification Search
CPC .... H01P 3/08; H01P 3/082; H01P 5/18; H01P 5/184
USPC .......................................................... 333/238
See application file for complete search history.

(56) References Cited

U.S. PATENT DOCUMENTS

| 5,907,266 | A  | * | 5/1999  | Budka           | H01P 1/2135 333/116 |
| 8,299,871 | B2 | * | 10/2012 | Carrillo-Ramirez | H01P 5/187 333/116 |
| 9,338,882 | B2 | * | 5/2016  | Xiao            | H01P 3/08 |

* cited by examiner

*Primary Examiner* — Dean O Takaoka
(74) *Attorney, Agent, or Firm* — Shumaker, Loop & Kendrick, LLP; James D. Miller

(57) ABSTRACT

A high directivity compact size inter-layer coupler that has application for coupling off a pre-distortion coupling signal from a main signal at an output of a power amplifier to a pre-distortion circuit. The coupler includes a main signal line formed on a surface of a first dielectric layer opposite to a second dielectric layer, where the main signal line receives the main signal, and a coupling line formed between the second dielectric layer and a third dielectric layer, where the coupling line is electromagnetically coupled to the main line so as to generate the coupling signal thereon. The coupling line has a general U-shape including a first leg portion, a second leg portion and a transverse portion between the first and second leg portions. The transverse portion includes a plurality of spaced apart blocks coupled together by a narrow line portion.

20 Claims, 2 Drawing Sheets

HIGH DIRECTIVITY COMPACT SIZE INTER LAYER COUPLER

BACKGROUND

Field

This disclosure relates generally to a high directivity compact size inter-layer coupler and, more particularly, to a high directivity compact size inter-layer coupler that includes a main signal line formed on a top dielectric layer and a coupled line formed on an inner dielectric layer, where the coupled line includes narrow line portions connecting block portions to improve the directivity of the coupler.

Discussion

Telecommunications systems continue to improve in efficiency and throughput, such as through fourth generation (4G) to fifth generation (5G) products and services. In a typical telecommunications system, the transmitter employs digital components that convert digital bits to be transmitted at a particular point in time into in-phase and quadrature-phase symbol constellations for transmission. These symbols are mapped to corresponding analog signals that modulate a carrier, and the signal is amplified by a power amplifier (PA) to be transmitted over some distance, where the power amplifier is printed on a printed circuit board (PCB) having a number of board layers along with other system components. Power amplifiers often operate at or near their saturation level to provide high throughput and increased efficiency, which causes signal non-linearities that distort the transmitted signal. Therefore, some type of signal correction is typically required in the transmitter. Telecommunications systems thus often provide digital pre-distortion (DPD) of the digital signal before it is converted to an analog signal to be amplified by the power amplifier that reshapes the signal using a digital signal processing operation to reverse the distortion caused by the power amplifier so that the transmitted signal is not distorted.

The transmitter circuitry in a telecommunications system of the type discussed above generally includes a coupler that couples off a portion of the amplified main signal to be transmitted to be used as a feedback signal to the DPD circuit. These couplers need to operate at high power, have a low insertion loss and be separated from the main signal line. These couplers come in a number of designs depending on the specific application. Generally, these designs include couplers that are discrete components, which requires added space and cost, couplers that are printed on a top layer of the PCB for the power amplifier where many other signal lines need to be provided, and couplers that include a main signal line printed on a top layer of the PCB and a coupled line printed on an inter-layer of the PCB. As telecommunications system improve and increase in performance these couplers also need to become increasingly smaller in size and with a reduced cost. Therefore, improvements to the known designs are needed.

SUMMARY

The following discussion discloses and describes a high directivity compact size inter-layer coupler that has application for coupling off a pre-distortion coupling signal from a main signal at an output of a power amplifier and provide it to a pre-distortion circuit. The coupler includes a plurality of dielectric layers having at least a first dielectric layer, a second dielectric layer adjacent to the first dielectric layer and third dielectric layer adjacent to the second dielectric layer and opposite to the first dielectric layer. The coupler also includes a main signal line formed on a surface of the first dielectric layer opposite to the second dielectric layer, where the main signal line receives the main signal, and a coupling line formed between the second and third dielectric layers, where the coupling line is electromagnetically coupled to the main line so as to generate the coupling signal thereon. The coupling line has a general U-shape including a first leg portion, a second leg portion and a transverse portion between the first and second leg portions. The transverse portion includes a plurality of spaced apart blocks coupled together by a narrow line portion.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a directional inter-layer coupler is merely exemplary in nature, and is in no way intended to limit the disclosure or its applications or uses. For example, the coupler is described as having particular application for providing a feedback signal from a power amplifier for providing pre-distortion of a digital signal in a telecommunications system. However, as will be appreciated by those skilled in the art, the coupler described herein will have other applications.

Figure 1:
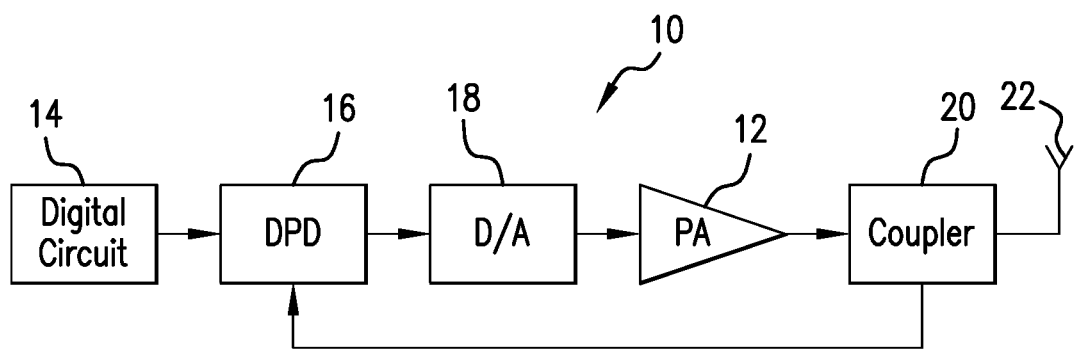
FIG. 1 is a simplified block diagram of a communications system employing a high power amplifier and a coupler.

FIG. 1 is a simplified block diagram of a telecommunications system 10 employing a power amplifier (PA) 12. The system 10 is intended to represent any suitable telecommunications system consistent with the discussion herein including, for example, 4G and 5G systems. The system 10 includes a digital circuit 14 that generates a digital signal to be transmitted that is then pre-distorted by a DPD 16. The pre-distorted digital signal is converted to an analog signal by a digital-to-analog (D/A) converter 18 before being sent to the PA 12 for amplification. The system 10 also includes a coupler 20 that couples off a sample portion of the amplified signal provided as a feedback signal that is sent to the DPD 16 and is used as a reference signal for the digital pre-distortion, where the pre-distortion can be performed in any suitable manner known to those skilled in the art. Therefore, the pre-distortion in the analog signal from the D/A converter 18 is removed by the non-linear effects caused by saturation of the PA 12 so that the signal transmitted by an antenna 22 is not distorted. This type of digital pre-distortion using a coupler to provide a feedback signal for use as a pre-distortion reference signal is well understood by those skilled in the art.

As mentioned above, it is desirable to reduce the size and cost of the couplers used in telecommunications system for this purpose. As will be discussed in detail below, the present disclosure is directed to such a coupler that includes a main signal line that receives the amplified signal provided on a top surface of a top dielectric layer of a printed circuit board (PCB) on which the PA 12 is fabricated and a coupler signal line fabricated on an inner layer of the PCB, where the PCB includes four component layers.

Figure 2:
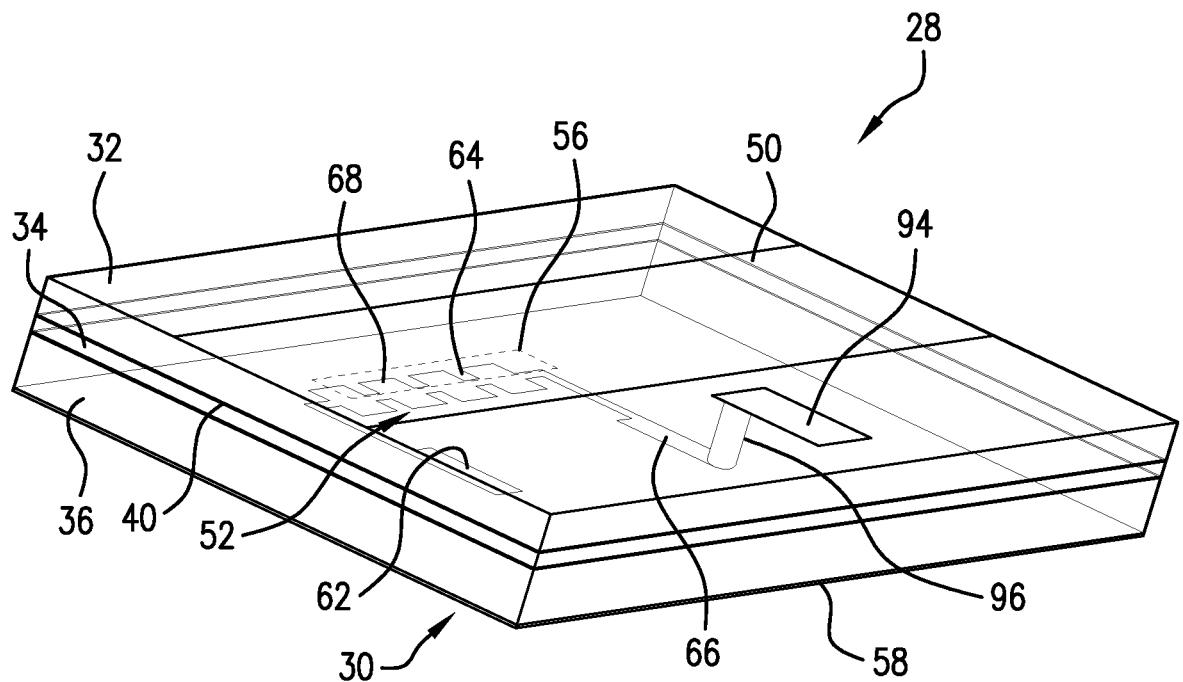
FIG. 2 is an isometric line drawing of a coupler that can be used as the coupler shown in FIG. 1.
Figure 3:
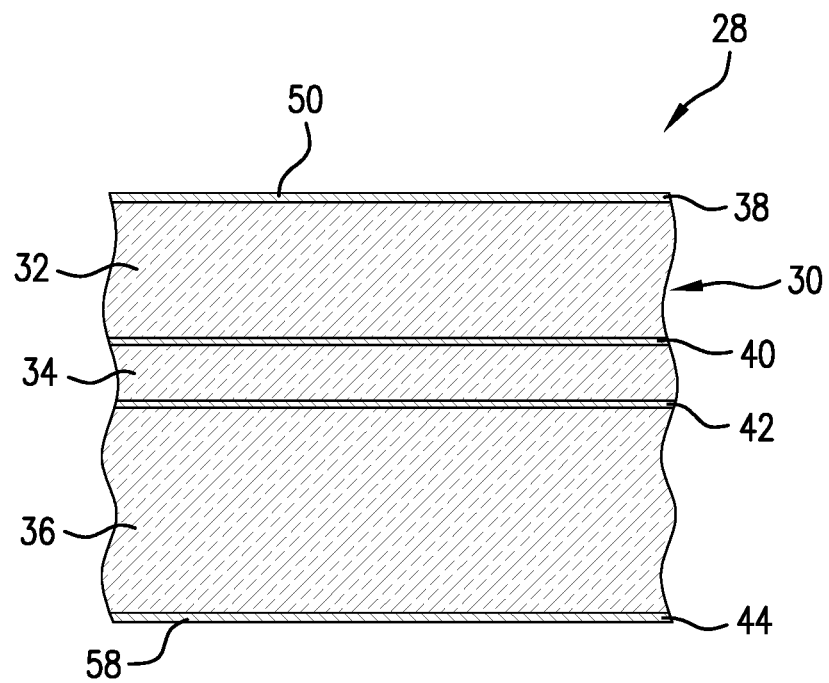
FIG. 3 is a side view of the coupler shown in FIG. 2.
Figure 4:
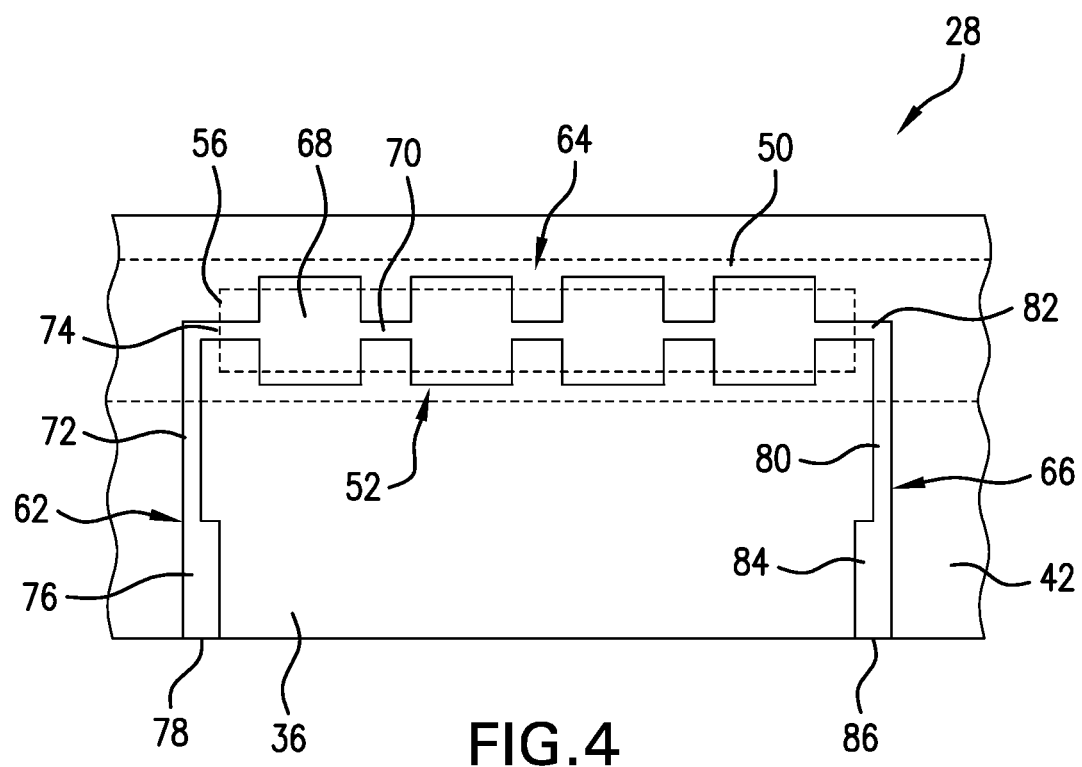
FIG. 4 is a top view of the coupler shown in FIG. 2 with the first two layers removed.

FIG. 2 is an isometric line drawing, FIG. 3 is a side view and FIG. 4 is a top view of a coupler 28 of this type that can be used as the coupler 20 in the system 10. The coupler 28 is fabricated on a PCB 30 having a top dielectric layer 32, a middle dielectric layer 34, and a bottom dielectric layer 36. The coupler 28 includes a main signal layer 38 formed on a top surface of the top dielectric layer 32, a first ground layer 40 between the top dielectric layer 32 and the middle dielectric layer 34 and formed either on the bottom surface of the top dielectric layer 32 or the top surface of the middle dielectric layer 34, a stripline layer 42 between the middle dielectric layer 34 and the bottom dielectric layer 36 and formed either on the bottom surface of the middle dielectric layer 34 or the top surface of the bottom dielectric layer 36, and a second ground layer 44 formed on a bottom surface of the bottom dielectric layer 36. Although not specifically shown, the PCB 30 is also the board on which the PA 12 is fabricated and possibly the circuit 14, the DPD 16 and the D/A converter 18 along with other system components, where the components for those devices would also be formed on the various surfaces of the dielectric layers 32, 34 and 36. The dielectric layers 32, 34 and 36 can be of any material and thickness for the purposes discussed herein. In this non-limiting embodiment, the dielectric layer 32 is R4350 and is about 20 mils thick, the dielectric layer 34 is FR4, a glass-reinforced epoxy laminate material, and is about 8.4 mils thick, and the dielectric layer 36 is FR4 and is about 30 mils thick.

The main signal layer 38 includes a main signal line 50 that receives the amplified signal to be transmitted from the PA 12 at the left side. In this non-limiting embodiment, the signal line 50 is a 500 microstrip line of a suitable metal deposited on the top surface of the top dielectric layer 32 and having a width of about 44 mils. The stripline layer 42 includes a microstrip coupling line 52 of a suitable metal fabricated in the configuration shown. The first ground layer 40 includes a metalized ground plane 54 having a cut-out section 56 so as to allow electromagnetic signal coupling between the main signal line 50 and the coupling line 52. In this non-limiting embodiment, the cut-out section 56 has a rectangular configuration to improve the coupling between the main line 50 and the coupling line 52 and has, for example, a length of 5 mm and a width of 25 mils. The second ground layer 44 includes a metalized ground plane 58.

FIG. 4 shows the dielectric layers 32 and 34 removed to better illustrate the coupling line 52, where the main signal line 50 and the cut-out section 56 are shown in phantom. The coupling line 52 has a general U-shape including a first leg portion 62, a transverse portion 64 and a second leg portion 66. The transverse portion 64 includes a number of blocks 68 separated by narrow line portions 70. The first leg portion 62 includes a narrow line portion 72 coupled to a narrow line portion 74 at one end of the transverse portion 64 and coupled to a wide line portion 76 at one port 78 of the coupler 28. The second leg portion 66 includes a narrow line portion 80 coupled to a narrow line portion 82 at an opposite end of the transverse portion 64 and coupled to a wide line portion 84 at another port 86 of the coupler 28. The dimensions of the various sections of the coupling line 52 referred to above will be application specific depending on the particular system and the frequencies of the signals. In one non-limiting embodiment, the blocks 68 have a width of 33 mils and a length of 0.8 mm, and have a space between the blocks 68 of 0.4 mm. Further, the number of the blocks 68 is four, although any suitable number can be used. The narrow line portions 70, 72, 74, 80 and 82 have a width of 6 mils and the narrow line portions 72 and 80 have a length of 1.5 mm. The wide line portions 76 and 84 have a width of 12 mils.

The amplified signal from the PA 12 is provided and impedance matched to input port of the main signal line 50 and is output to the antenna 22 at output port. Port 86 of the coupling line 52 is impedance matched to a 500 load 94 formed on the top surface of the top dielectric layer 32 by a suitable through via 96 and port 78 is connected to the DPD 16, so that a minimal amount of the coupling signal is provided to the port 86 and most of the coupling signal flows from the port 78. The measure of the proportion of the coupling signal provided to the port 78 defines the directivity of the coupler 28. The configuration of the blocks 68 and the narrow line portions 70 as described above limits the amount of signal provided at the port 86, thus improving the directivity of the coupler 28. The narrow line portions 72 and 80 between the end narrow line portions 74 and 82, respectively, and the wide line portions 76 and 84 at the ports 78 and 86, respectively, improve the voltage standing wave ratio (VSWR) of the coupler 28, which is a measure of its impedance matching.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A coupler for coupling off a coupling signal from a main signal, said coupler comprising:
  a plurality of dielectric layers including at least a first dielectric layer, a second dielectric layer adjacent to the first dielectric layer and third dielectric layer adjacent to the second dielectric layer and opposite to the first dielectric layer;
  a main signal line formed on a surface of the first dielectric layer opposite to the second dielectric layer, said main signal line being responsive to the main signal; and
  a coupling line formed between the second and third dielectric layers, said coupling line having a general U-shape including a first leg portion, a second leg portion and a transverse portion between the first and second leg portions, said transverse portion including a plurality of spaced apart blocks coupled together by narrow line portions, said coupling line being electromagnetically coupled to the main line so as to generate the coupling signal thereon.

2. The coupler according to claim 1 further comprising a ground plane formed between the first and second dielectric layers, said ground plane including a cut-out section between the main line and the coupling line so as to allow the electromagnetic coupling therebetween.

3. The coupler according to claim 2 wherein the cut-out section is rectangular.

4. The coupler according to claim 3 wherein the cut-out section has a width of 25 mils and a length of 5 mm.

5. The coupler according to claim 1 wherein the first and second leg portions each include a narrow line portion coupled to a narrow line portion at an end of the transverse portion and a wide line portion coupled to the narrow line portion.

6. The coupler according to claim 5 wherein the narrow line portions in the first and second leg portions have a length of 1.5 mm.

7. The coupler according to claim 5 wherein the narrow line portions in the first and second leg portions and the transverse portion have a width of 6 mils and the wide line portions have a width of 12 mils.

8. The coupler according to claim 1 wherein the blocks have a width of 33 mils and a length of 0.8 mm.

9. The coupler according to claim 1 wherein the plurality of blocks is four blocks.

10. The coupler according to claim 1 wherein the main signal is an output signal of a power amplifier and the coupling signal is a feedback signal for a pre-distortion circuit.

11. The coupler according to claim 1 further comprising a ground plane on the third dielectric layer opposite to the coupling line.

12. A coupler for coupling off a coupling signal from a main signal, said coupler comprising:
  a plurality of stacked dielectric layers;
  a main signal line formed on an outer surface of an outer dielectric layer, said main signal line being responsive to the main signal; and
  a coupling line formed on an inner dielectric layer, said coupling line including a transverse portion having a plurality of spaced apart blocks coupled together by narrow line portions, said coupling line being electromagnetically coupled to the main line so as to generate the coupling signal thereon.

13. The coupler according to claim 12 wherein the coupling line further includes a first leg portion coupled to one end of the transverse portion and a second leg portion coupled to another end of the transverse portion.

14. The coupler according to claim 13 wherein the first and second leg portions each include a narrow line portion coupled to a narrow line portion at an end of the transverse portion and a wide line portion coupled to the narrow line portion.

15. The coupler according to claim 12 wherein the plurality of blocks is four blocks.

16. The coupler according to claim 12 further comprising a ground plane formed between the first and second dielectric layers, said ground plane including a cut-out section between the main line and the coupling line so as to allow the electromagnetic coupling therebetween.

17. The coupler according to claim 16 wherein the cut-out section is rectangular.

18. The coupler according to claim 12 wherein the main signal is an output signal of a power amplifier and the coupling signal is a feedback signal for a pre-distortion circuit.

19. A coupler for coupling off a coupling signal from a main signal at an output of a power amplifier, said coupling signal being a feedback signal to a pre-distortion circuit, said coupler comprising:
  a plurality of dielectric layers including at least a first dielectric layer, a second dielectric layer adjacent to the first dielectric layer and third dielectric layer adjacent to the second dielectric layer and opposite to the first dielectric layer;
  a main signal line formed on a surface of the first dielectric layer opposite to the second dielectric layer, said main signal line being responsive to the main signal;
  a coupling line formed between the second and third dielectric layers, said coupling line having a general U-shape including a first leg portion, a second leg portion and a transverse portion between the first and second leg portions, said transverse portion including a plurality of spaced apart blocks coupled together by narrow line portions, wherein the first and second leg portions each include a narrow line portion coupled to a narrow line portion at an end of the transverse portion and a wide line portion coupled to the narrow line portion; and
  a ground plane formed between the first and second dielectric layers, said ground plane including a rectangular cut-out section between the main line and the coupling line, said coupling line being electromagnetically coupled to the main line through the cut-out section so as to generate the coupling signal thereon.

20. The coupler according to claim 19 wherein the plurality of blocks is four blocks.

* * * * *